(12) United States Patent
Kim et al.

(10) Patent No.: US 10,804,662 B2
(45) Date of Patent: Oct. 13, 2020

(54) DEVICE FOR DRIVING MOTOR

(71) Applicant: LSIS CO., LTD., Anyang-si, Gyeonggi-do (KR)

(72) Inventors: Jae-Sung Kim, Anyang-si (KR); Dong-Sik Kim, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 16/367,736

(22) Filed: Mar. 28, 2019

(65) Prior Publication Data
US 2019/0334303 A1   Oct. 31, 2019

(30) Foreign Application Priority Data

Apr. 26, 2018 (KR) .......................... 10-2018-0048675

(51) Int. Cl.
*H05K 5/00* (2006.01)
*H05K 7/20* (2006.01)
*H01R 33/06* (2006.01)
*H02K 11/33* (2016.01)
(Continued)

(52) U.S. Cl.
CPC ........... *H01R 33/06* (2013.01); *H01R 12/716* (2013.01); *H01R 13/50* (2013.01); *H02K 11/33* (2016.01); *H05K 5/0069* (2013.01); *H05K 7/20909* (2013.01); *H02K 2211/03* (2013.01)

(58) Field of Classification Search
CPC ...... H05K 1/189; H05K 1/14; H05K 7/20172; H05K 7/1432; H05K 7/20145; H05K 7/20909; H05K 5/0069; H01R 33/06; H01R 13/50; H01R 12/716; H02K 11/33; H02K 2211/03
See application file for complete search history.

(56) References Cited

U.S. PATENT DOCUMENTS

2003/0200761 A1* 10/2003 Funahashi ............... F04B 35/04
                                                              62/228.4
2005/0063155 A1*  3/2005 Endo ................... H05K 7/20172
                                                                361/695
(Continued)

FOREIGN PATENT DOCUMENTS

EP       3211981 A1    8/2017
JP       02008192 U    1/1990
(Continued)

OTHER PUBLICATIONS

European Search Report for related European Application No. 19000096.8; action dated Sep. 19, 2019; (3 pages).
(Continued)

*Primary Examiner* — Adam B Dravininkas
(74) *Attorney, Agent, or Firm* — K&L Gates LLP

(57) ABSTRACT

A motor-driving device for varying power supplied from an external power source and supplying the varied power to a motor includes a lower base; a middle base disposed above the lower base; a cooling fan disposed between the lower base and the middle base; a connector disposed on the middle base, where the connector is electrically connected to the cooling fan; and a substrate disposed above the middle base, wherein the connector is disposed between the substrate and the middle base, wherein the connector is electrically connected to the substrate.

12 Claims, 6 Drawing Sheets

(51) Int. Cl.
*H01R 12/71* (2011.01)
*H01R 13/50* (2006.01)

(56) References Cited

U.S. PATENT DOCUMENTS

| | | | | |
|---|---|---|---|---|
| 2007/0279865 | A1* | 12/2007 | Yoshida | H02M 7/003 |
| | | | | 361/697 |
| 2009/0244845 | A1* | 10/2009 | Nagamoto | H05K 7/20918 |
| | | | | 361/697 |
| 2010/0166574 | A1* | 7/2010 | Zha | H01L 23/4006 |
| | | | | 417/362 |
| 2017/0244335 | A1* | 8/2017 | Lim | H05K 7/1432 |
| 2017/0245387 | A1* | 8/2017 | Kim | H05K 5/0017 |
| 2018/0023580 | A1* | 1/2018 | Ishizaki | H02K 9/02 |
| | | | | 417/368 |

FOREIGN PATENT DOCUMENTS

| | | | |
|---|---|---|---|
| JP | 2009253183 | A | 10/2009 |
| JP | 2017153347 | A | 8/2017 |
| WO | 2008032542 | A1 | 3/2008 |

OTHER PUBLICATIONS

Japanese Office Action for related Japanese Application No. 2019-016805; report dated Mar. 24, 2020; (3 pages).

* cited by examiner

DEVICE FOR DRIVING MOTOR

CROSS-REFERENCE TO RELATED APPLICATION

Pursuant to 35 U.S.C. § 119(a), this application claims the benefit of earlier filing date and right of priority to Korean Application No. 10-2018-0048675, filed on Apr. 26, 2018, in the Korean Intellectual Property Office, the disclosure of which is incorporated herein in its entirety by reference.

TECHNICAL FIELD

The present disclosure relates to a motor-driving device with an improved structure.

BACKGROUND

Generally, a motor-driving device refers to a device that can control a speed of a motor with a high efficiency by varying a voltage and frequency of a power supplied from an external power supply and supplying the power with the varied voltage and frequency to the motor.

The conventional motor-driving device will be described as follows.

Conventionally, the conventional motor-driving device has an assembly structure in which a circuit module is housed in a casing body and a cover and a cooling fan for cooling the circuit module is disposed.

The cooling fan is connected to the circuit module through a cable and a terminal and receive a power therethrough. In the conventional motor-driving device, a connection between the cable and the circuit module must be manually connected, resulting in a long manufacturing time and a product cost increase due to a manual labor.

Further, in the conventional motor-driving device, the cable could be moved inside the motor-driving device while the cooling fan is connected to the substrate. Thus, there is a problem that a sheath of the cable may melt or the cable may be short-circuited due to a heat from elements mounted on the circuit module.

SUMMARY

An purpose of the present disclosure is to provide a motor-driving device in which improving of an internal structure of the motor-driving device is carried out such that the cooling fan and substrate may be automatically connected to each other when the substrate is mounted on the middle base.

In one aspect of the present disclosure, there is provided a motor-driving device for varying power supplied from an external power source and supplying the varied power to a motor, the device comprising: a lower base; a middle base disposed above the lower base; a cooling fan disposed between the lower base and the middle base; a connector disposed on the middle base, where the connector is electrically connected to the cooling fan; and a substrate disposed above the middle base, wherein the connector is disposed between the substrate and the middle base, wherein the connector is electrically connected to the substrate.

In one implementation, the connector includes a male connector a female connector, wherein the connector and the cooling fan are electrically connected to each other via an electrical wire.

In one implementation, the device further comprises a socket on a bottom face of the substrate at a position corresponding to a position of the connector, wherein the socket is electrically connected to the connector.

In one implementation, the substrate has a first fastening hole defined therein, wherein the middle base has a substrate fixing pin disposed thereon, wherein the substrate fixing pin is inserted into the first fastening hole such that the connector and the socket are connected to each other while the substrate and the middle base are spaced apart by a predetermined distance.

In one implementation, a connector receiving portion protrudes from a top face of the middle base, wherein the connector receiving portion is constructed to receive the connector therein.

In one implementation, a guide rib a protrudes from both side faces of the connector, wherein the connector receiving portion has a guide groove a defined therein into which the guide rib a is inserted.

In one implementation, the connector include two connectors extending from the cooling fan, wherein the two connectors are horizontally spaced from each other, wherein each connector is made of a conductive metal material, wherein each connector protrudes upwardly from the middle base toward the substrate.

In one implementation, the middle base has two throughholes defined therein, wherein each connector passes through each through-hole and protrudes upwards from the middle base.

In one implementation, each connector has a middle portion made of an elastic material including elastic means.

In one implementation, the substrate has two electricalconducting holes 241 defined therein into which the two connectors are inserted respectively.

In one implementation, the device further comprises two fixing blocks disposed on a bottom face of the substrate, wherein each of the two fixing blocks has a second fastening hole defined therein through which each connector passes, wherein the two fixing blocks are constructed for supporting the substrate while maintaining a spacing between the two connectors.

In one implementation, each of the fixing block is fastened to each of the connectors.

In one implementation, each of the fixing blocks is made of an insulating material.

In one implementation, the cooling fan includes at least one cooling fan between the lower base and the middle base, wherein the device further comprises heat-dissipating means disposed between the lower base and the middle base to heat-dissipate the substrate.

In accordance with the present disclosure, the cooling fan is automatically connected to the substrate during the assembling of the substrate to the middle base, thereby shortening the assembly process, reducing the product cost. Further, a connection part connecting the cooling fan and the substrate is fixed, thereby reducing the risk of short-circuiting.

Further specific effects of the present disclosure as well as the effects as described above will be described in conduction with illustrations of specific details for carrying out the invention.

DETAILED DESCRIPTION

Figure 1:
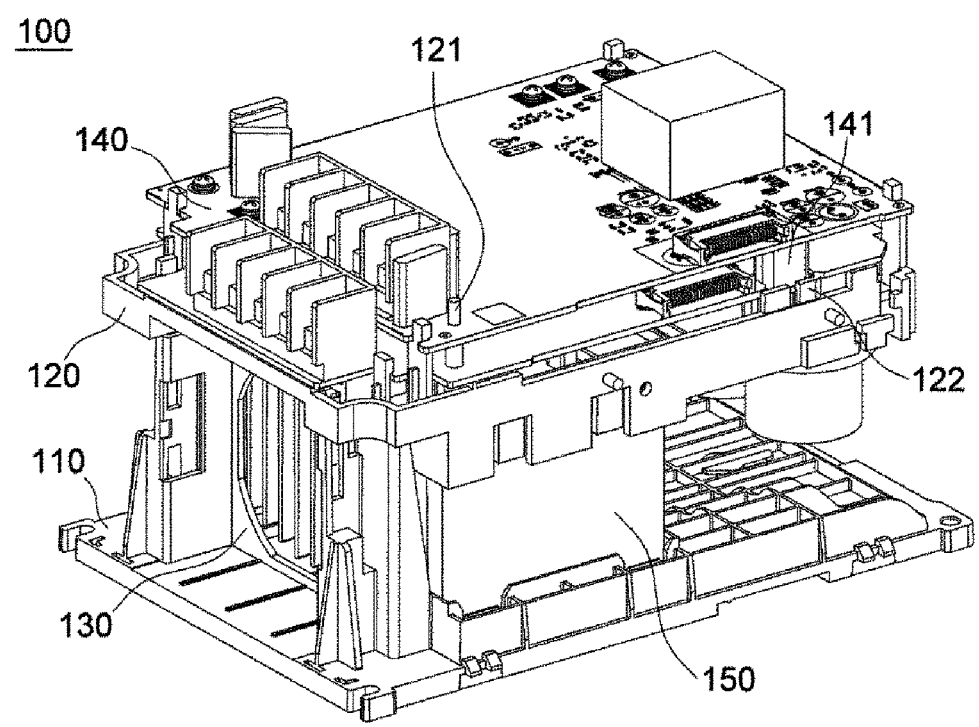
FIG. 1 is a perspective view of a motor-driving device according to a first embodiment of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Hereinafter, a motor-driving device with an improved structure in accordance with the present disclosure will be described with reference to the accompanying drawings.

Figure 2:
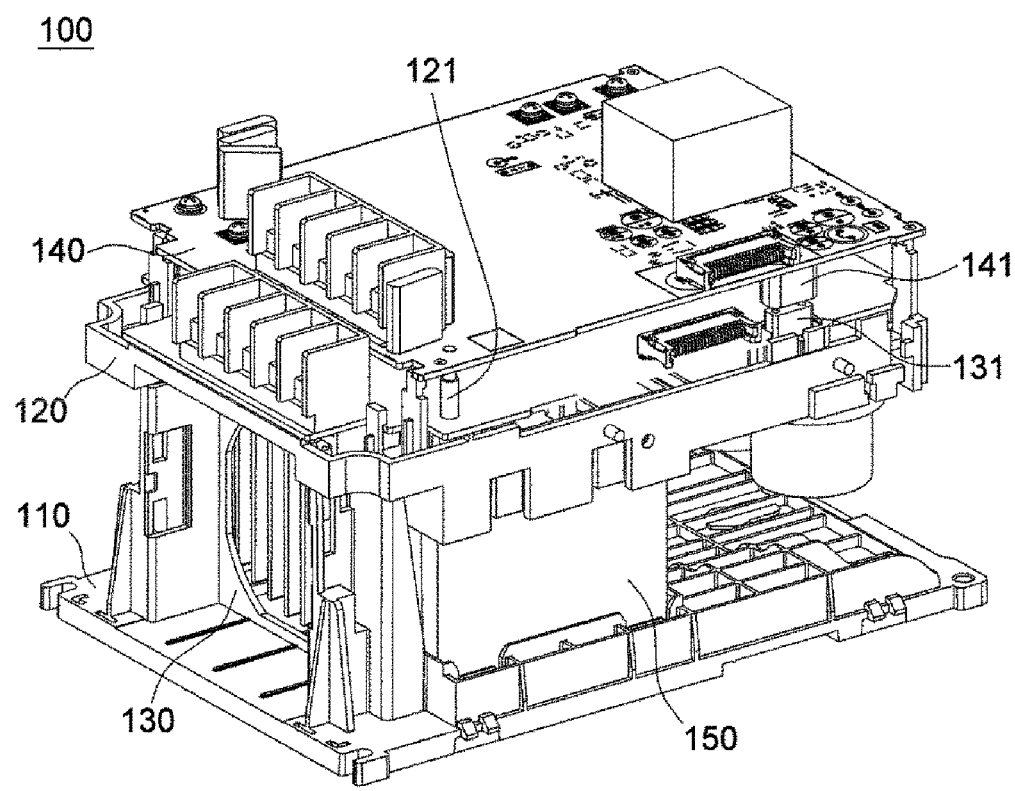
FIG. 2 shows a state before a substrate is mounted in FIG. 1.
Figure 3:
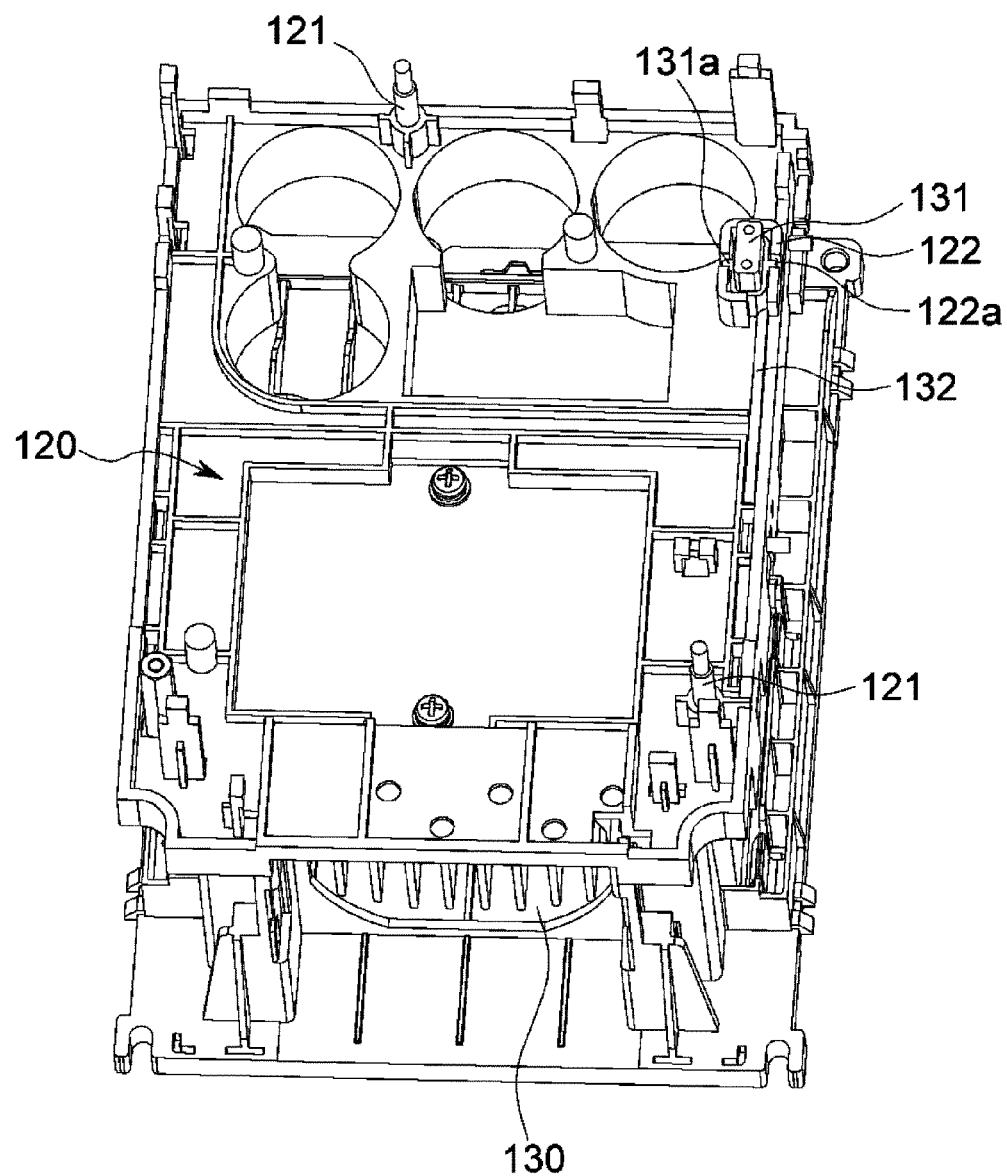
FIG. 3 is a view of a middle base in FIG. 2.

FIG. 1 is a perspective view of a motor-driving device according to a first embodiment of the present disclosure. FIG. 2 shows a state before a substrate is mounted in FIG. 1. FIG. 3 is a view of a middle base in FIG. 2.

Figure 4:
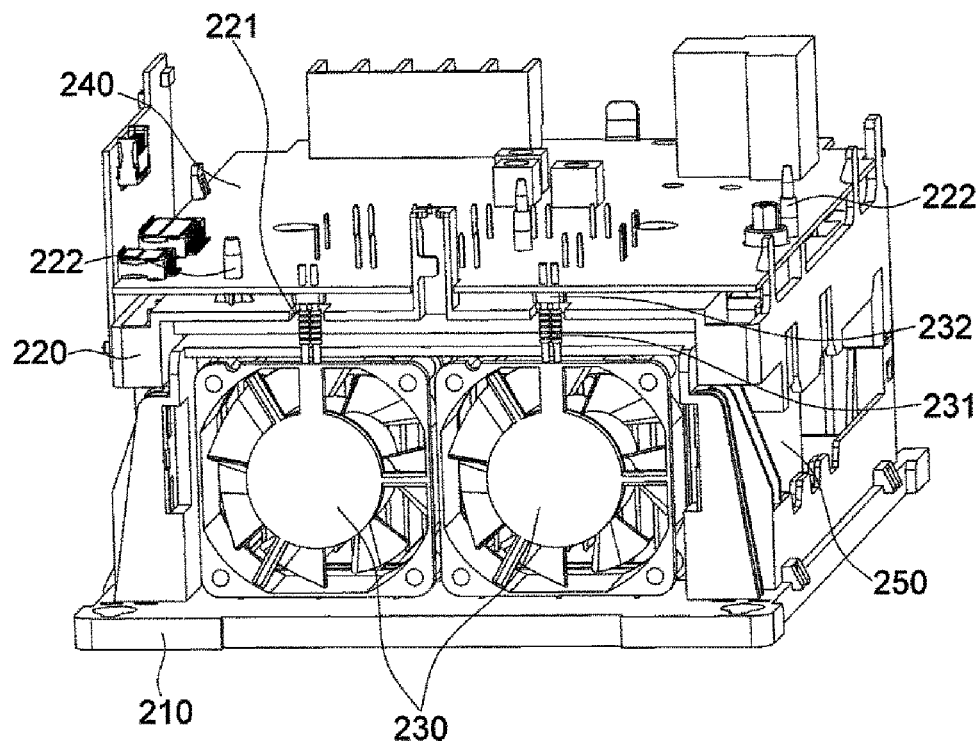
FIG. 4 is a partial perspective view of a motor-driving device according to a second embodiment of the present disclosure.
Figure 5:
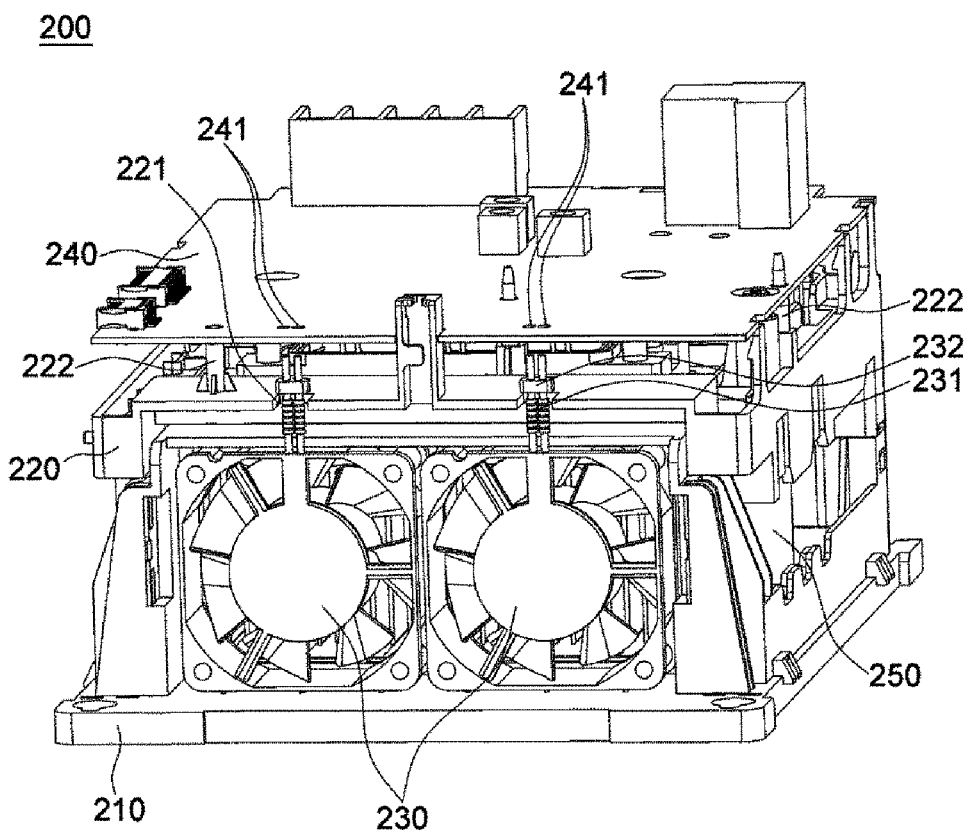
FIG. 5 shows a state before a substrate is mounted in FIG. 4.
Figure 6:
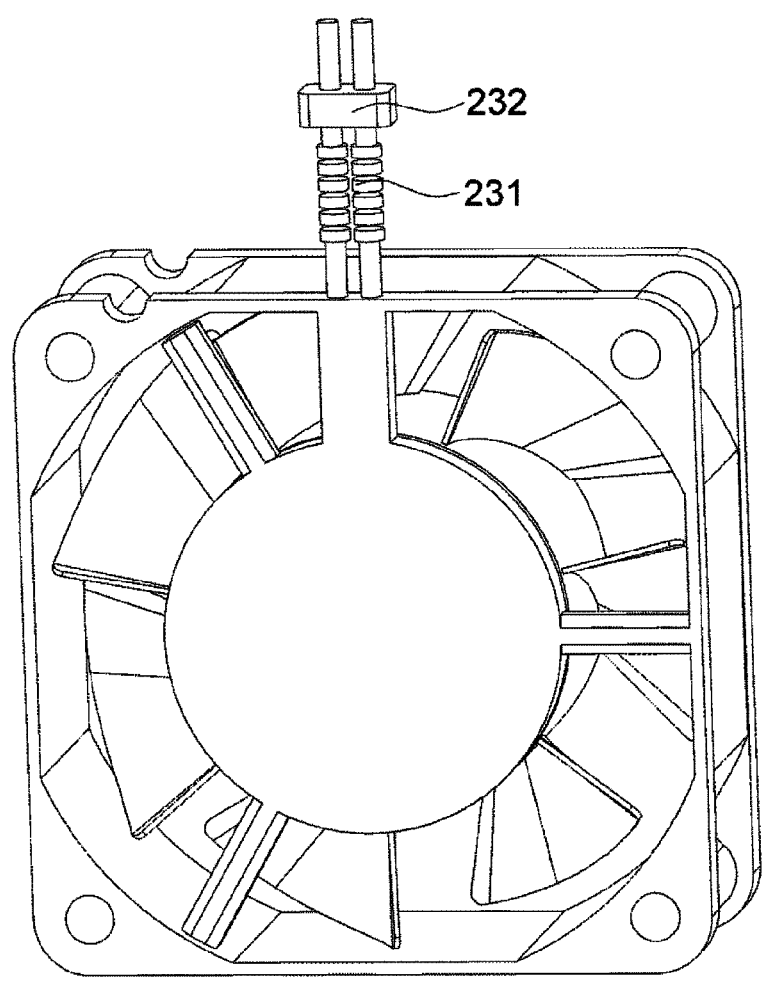
FIG. 6 is a view of a positioned cooling fan in FIG. 4.

FIG. 4 is a partial perspective view of a motor-driving device according to a second embodiment of the present disclosure. FIG. 5 shows a state before a substrate is mounted in FIG. 4. FIG. 6 is a view of a positioned cooling fan in FIG. 4.

Each of the motor-driving devices of the first and second embodiments of the present disclosure may include a lower base 110 or 210, a middle base 120 or 220 disposed on the lower base 110 or 210, a connector 131 or 231 located on the middle base 120 or 220, a cooling fan 130 or 230 disposed between the lower base 110 or 210 and the middle base 120 or 220, and a substrate 140 or 240 disposed on the middle base 120 or 220 and connected to the connector 131 or 231.

Further, at least one cooling fan 130 or 230 may be disposed between the lower base 110 or 210 and the middle base 120 or 220. Between the lower base 110 or 210 and the middle base 120 or 220, heat-dissipating means 150 or 250 may be further disposed for heat-dissipating the substrate 140 or 240.

The motor-driving device in accordance with the present disclosure has a structure in which the substrate 140 or 240 is directly electrically connected to the cooling fan 130 or 230 when the substrate 140 or 240 is mounted on the middle base 120 or 220. Therefore, the manufacturing process may be simplified, the manufacturing cost may be reduced, and durability of the device may be improved.

Referring to FIG. 1 to FIG. 3, according to one or first embodiment of the present disclosure, a motor-driving device 100 includes a lower base 110, a middle base 120, a cooling fan 130, a substrate 140, and heat-dissipating means 150.

The lower base 110 serves as a lower housing of the motor-driving device 100. The heat-dissipating means 150 or the cooling fan 130 which will be described later may be disposed on the lower base 110.

Further, the lower base 110 may be formed integrally with the heat-dissipating means 150 as described later via injection molding.

The heat-dissipating means 150 for heat-dissipating the substrate 140 may be disposed between the lower base 110 and the middle base 120.

That is, the heat-dissipating means 150 may refer to a device for absorbing the heat of the substrate 140 and discharging the heat to the outside. Thus, the heat-dissipating means 150 may be called a heat sink.

The cooling fan 130 may be provided for cooling the heat by supplying outside air to the heat-dissipating means 150 and the substrate 140. At least one cooling fan 130 may be disposed between the lower base 110 and the middle base 120.

Further, the cooling fan 130 may include a connector 131 for receiving power from the substrate 140, which will be described later. Since the substrate 140 is disposed on the middle base 120, the connector 131 may be disposed on the middle base 120.

The middle base 120 is disposed above the lower base 110. The middle base 120 may be fastened to a top face of the heat-dissipating means 150 via sliding or bolt coupling.

At least one substrate 140 may be disposed on the middle base 120. The substrate 140 may be divided into a power board, a cap board, a control board, and an input/output (IO) board. However, the present disclosure may not be limited thereto. The substrate 140 may be formed of a single substrate.

Since the boards of the substrate 140 are electrically connected to each other, a element or connector for supplying power to the cooling fan 130 which will be described later may be disposed on any type of the substrate.

In accordance with the present disclosure, a board which is spaced a predetermined distance from the middle base 120 is defined as the substrate 140, thereby to facilitate easy connection between the substrate 140 and the cooling fan 130.

Specifically, in the motor-driving device 100 according to the first embodiment of the present disclosure, the connector 131 for the cooling fan 130 may be embodied as a male connector or a female connector. The connector 131 and the cooling fan 130 may be connected to each other via an electrical wire 132.

In such a structure of the cooling fan 130, a socket 141 electrically connected to the connector 131 may be disposed on a bottom face of the substrate 140 at a position corresponding to a position of the connector 131. Accordingly, when the substrate 140 is mounted on the middle base 120, the connector 131 and the socket 141 may be directly connected to each other.

Further, in order to stably support the substrate 140 with considering a connection height between the socket 141 disposed on the bottom face of the substrate 140 and the connector 131, the substrate 140 has a first fastening hole defined therein. Moreover, a substrate fixing pin 121 to be inserted in the first fastening hole may be disposed on a top face of the middle base 120 so that the substrate 140 is disposed at a level corresponding to the connection height between the connector 131 and the socket 141. Specifically, the substrate fixing pin 121 is inserted into the first fastening hole so that the connector 131 and the socket 141 are connected to each other while the substrate 140 and the middle base 120 are spaced apart by a predetermined distance.

The substrate fixing pin 121 may be integrally formed with the middle base 120. Further, the fixing pin 121 may have at least one step such that a diameter of the pin 121 is smaller at an upper portion thereof than at a lower portion thereof.

That is, as shown, the substrate fixing pin 121 has two steps such that a diameter of the pin 121 is smaller at an upper portion thereof than at a lower portion thereof. A upper step of the two steps may be inserted into the first fastening hole in the substrate 140.

Further, a connector receiving portion 122 may protrude from the top face of the middle base 120 to receive the connector 131 therein. The connector receiving portion 122 may facilitate the connection of the substrate 140 to the socket 141 by firmly securing the connector 131.

Further, in consideration of easiness in assembling, a guide rib 131a may protrude from both side faces of the connector 131. A guide groove 122a into which the guide rib 131a is inserted may be formed in the connector receiving portion 122.

Further, the connector receiving portion 122 may be disposed below the socket and at a position corresponding to a position of the socket 14.

In brief, the manufacturing process of the motor-driving device 100 according to one embodiment of the present disclosure will be described roughly. First, the heat-dissipating means 150 is placed on the lower base 110. The middle base 120 is mounted on the heat-dissipating means 150 and above the lower base 110. The cooling fan 130 is mounted between the lower base 110 and the middle base 120 in outer regions thereof. The electrical wire 132 and the connector 131 connected to the cooling fan 130 are fixed on the middle base 120. Then, when the substrate 140 is fastened on the middle base 120, the socket 141 of the substrate 140 and the connector 131 are directly fastened to each other. Therefore, the manufacturing time is shortened and the durability of the device 100 is improved.

Referring to FIG. 4 to FIG. 6, according to another or second embodiment of the present disclosure, a motor-driving device 200 includes a lower base 210, a middle base 220, a cooling fan 230, a substrate 240, and heat-dissipating means 250.

The lower base 210 serves as a lower housing of the motor-driving device 200. The heat-dissipating means 250 or the cooling fan 230 which will be described later may be disposed on the lower base 210.

Further, the lower base 210 may be formed integrally with the heat-dissipating means 250 as described later via injection molding.

The heat-dissipating means 250 for heat-dissipating the substrate 240 may be disposed between the lower base 210 and the middle base 220.

That is, the heat-dissipating means 250 may refer to a device for absorbing the heat of the substrate 240 and discharging the heat to the outside. Thus, the heat-dissipating means 250 may be called a heat sink.

The cooling fan 230 may be provided for cooling the heat by supplying outside air to the heat-dissipating means 250 and the substrate 240. At least one cooling fan 230 may be disposed between the lower base 210 and the middle base 220.

Further, the cooling fan 230 may include a connector 231 for receiving power from the substrate 240, which will be described later. Since the substrate 240 is disposed on the middle base 220, the connector 231 may be disposed on the middle base 220.

The middle base 220 is disposed above the lower base 210. The middle base 220 may be fastened to a top face of the heat-dissipating means 250 via sliding or bolt coupling.

At least one substrate 240 may be disposed on the middle base 220. The substrate 240 may be divided into a power board, a cap board, a control board, and an input/output (IO) board. However, the present disclosure may not be limited thereto. The substrate 240 may be formed of a single substrate.

Since the boards of the substrate 240 are electrically connected to each other, an element or connector 231 for supplying power to the cooling fan 230 which will be described later may be disposed on any type of the substrate.

In accordance with the present disclosure, a board which is spaced a predetermined distance from the middle base 220 is defined as the substrate 240, thereby to facilitate easy connection between the substrate 240 and the cooling fan 230.

Specifically, in the motor-driving device 200 according to the second embodiment of the present disclosure, two cooling fans 230 are disposed. Thus, two connectors 231 for the cooling fans 230 respectively may be provided. The two connectors 231 may extend from the cooling fans 230 respectively. The two connectors 231 may be arranged horizontally. Each of the two connectors 231 may be made of a conductive metal and may protrude from the top face of the middle base 220 upwardly.

In such a structure of the cooling fan 230, the middle base 220 has two through-holes 221 defined therein. Each connector 231 may protrude upwardly from the middle base 220 through each through-hole 221.

Further, in order to stably support the substrate 240 with considering a connection height of the connector 231 to the substrate 240, the substrate 240 has a first fastening hole defined therein. Moreover, a substrate fixing pin 222 to be inserted in the first fastening hole may be disposed on a top face of the middle base 220 so that the substrate 240 is disposed at a level corresponding to the connection height between the connector 231 and the substrate 240. Specifically, the substrate fixing pin 222 is inserted into the first fastening hole so that the connector 231 and the substrate 240 are connected to each other while the substrate 240 and the middle base 220 are spaced apart by a predetermined distance.

The substrate fixing pin 222 may be integrally formed with the middle base 220. Further, the fixing pin 222 may have at least one step such that a diameter of the pin 222 is smaller at an upper portion thereof than at a lower portion thereof.

That is, as shown, the substrate fixing pin 222 has two steps such that a diameter of the pin 222 is smaller at an upper portion thereof than at a lower portion thereof. A upper step of the two steps may be inserted into the first fastening hole in the substrate 240.

A pair of electrical-conducting holes 241 may be formed in the substrate 240. The pair of connectors 231 may be inserted into the pair of electrical-conducting holes 241 respectively such that the pair of connectors 231 are electrically connected to the substrate 240.

Further, with considering the connection height between the substrate 240 and the connector 231 and for the stable support of the substrate 240, two fixing blocks 232 may be provided to support a bottom face of the substrate 240 while maintaining a distance between the pair of connectors 231.

Thus, each of the fixing blocks 232 may be fastened to each of the connectors 231 and contact the bottom face of the substrate.

Each of the fixing blocks 232 has a second fastening hole through which each of the connectors 231 passes. Each of the fixing blocks 232 is engaged with each of the connectors 231 so that the spacing between the connectors 231 is maintained. Further, the fixing blocks 232 contacts the bottom face of the substrate 240 to support the substrate 240.

Further, each of the fixing blocks 232 may be made of an insulating material. The fixing block 232 may be made of an elastic material to absorb vibrations transmitted to the pair of the connectors 231 as the cooling fans 230 is driven.

Further, in consideration of the vibration caused by the driving of the cooling fan 230, a middle portion of each of the pair of the connectors 231 may be embodied as a spring or elastic material. Accordingly, the vibration due to the driving of the cooling fan 230 is not transmitted to the substrate 240, thereby improving durability of the device 200.

In brief, the motor-driving device 200 according to the second embodiment of the present disclosure may be manufactured as follows: the heat-dissipating means 250 is disposed on the lower base 210, and the middle base 220 is mounted on the heat-dissipating means 250, and the cooling fan 230 is mounted between the lower base 210 and the middle base 220 in outer regions thereof; then when the substrate 240 is fastened on the middle base 220, each connector 231 is inserted into each electrical-conducting hole 241 in the substrate 240 and is fastened to the substrate. Therefore, there occurs an advantage that the manufacturing time is shortened and the durability of the device 200 is improved.

It will be apparent to those skilled in the art that various modifications and variations may be made in the present invention without departing from the spirit of the present disclosure. The technical scope of the present disclosure is not limited to the contents described in the embodiments but should be determined by the claims and equivalents thereof.

What is claimed is:

1. A motor-driving device for varying power supplied from an external power source and supplying the varied power to a motor, the device comprising:
   a lower base;
   a middle base disposed above the lower base;
   a cooling fan disposed between the lower base and the middle base;
   a connector disposed on the middle base, wherein the connector is electrically connected to the cooling fan; and
   a substrate disposed above the middle base, wherein the connector is disposed between the substrate and the middle base, wherein the connector is electrically connected to the substrate,
   wherein the connector comprises two connectors extending from the cooling fan, wherein the two connectors are horizontally spaced from each other, wherein each of the two connectors is made of a conductive metal material, wherein each of the two connectors protrudes upwardly from the middle base toward the substrate.

2. The motor-driving device of claim 1, wherein the middle base has two through-holes defined therein, wherein each of the two connectors passes through each of the two through holes and protrudes upwards from the middle base.

3. The motor-driving device of claim 1, wherein each of the two connectors has a middle portion made of an elastic material or including elastic means.

4. The motor-driving device of claim 1, wherein the substrate has two electrical-conducting holes defined therein into which the two connectors are inserted, respectively.

5. The motor-driving device of claim 4, wherein the device further comprises two fixing blocks disposed on a bottom face of the substrate, wherein each of the two fixing blocks has a second fastening hole defined therein through which each of the two connectors passes, wherein the two fixing blocks are constructed for supporting the substrate while maintaining a spacing between the two connectors.

6. The motor-driving device of claim 4, wherein each of the fixing blocks is fastened to each of the connectors.

7. The motor-driving device of claim 4, wherein each of the fixing blocks is made of an insulating material.

8. The motor-driving device of claim 1, wherein the cooling fan includes at least one cooling fan between the lower base and the middle base,
   wherein the device further comprises heat-dissipating means disposed between the lower base and the middle base to heat-dissipate the substrate.

9. The motor-driving device of claim 5, wherein each of the fixing blocks is made of an elastic material.

10. The motor-driving device of claim 1, further comprising a substrate fixing pin disposed on a top face of the middle base, wherein the substrate fixing pin is configured to be inserted into a first fastening hole of the substrate.

11. The motor-driving device of claim 10, wherein the substrate fixing pin is integrally formed with the middle base.

12. The motor-driving device of claim 10, wherein the substrate fixing pin includes at least one step such that a diameter of an upper portion of the substrate fixing pin is smaller than a diameter of a lower portion of the substrate fixing pin.

\* \* \* \* \*